US010930432B2

(12) United States Patent
Jin et al.

(10) Patent No.: US 10,930,432 B2
(45) Date of Patent: Feb. 23, 2021

(54) WIDE RANGE CAPACITOR STANDARD BOX

(71) Applicant: CHENGDU KAIPU ELECTRONIC SCIENCE AND TECHNOLOGIES CO. LTD., Chengdu (CN)

(72) Inventors: Pan Jin, Chengdu (CN); Yanjun Xu, Chengdu (CN); Dian Jin, Chengdu (CN); Pu Lin, Chengdu (CN)

(73) Assignee: Chengdu Kaipu Electronic Science and Technologies Co. Ltd., Chengdu (CN)

( * ) Notice: Subject to any disclaimer, the term of this patent is extended or adjusted under 35 U.S.C. 154(b) by 193 days.

(21) Appl. No.: 16/253,534

(22) Filed: Jan. 22, 2019

(65) Prior Publication Data
US 2019/0237249 A1    Aug. 1, 2019

(30) Foreign Application Priority Data

Jan. 30, 2018   (CN) .......................... 201810088041.9

(51) Int. Cl.
*G01R 27/26*      (2006.01)
*H01G 5/38*       (2006.01)
(Continued)

(52) U.S. Cl.
CPC ........... *H01G 2/10* (2013.01); *G01R 27/2605* (2013.01); *G01R 35/02* (2013.01); *H01G 4/38* (2013.01); *H01G 5/38* (2013.01)

(58) Field of Classification Search
CPC ... H01G 2/10; H01G 4/38; H01G 5/38; G01R 27/2605; G01R 35/02
(Continued)

(56) References Cited

U.S. PATENT DOCUMENTS 4,924,173 A  *  5/1990  Dishman .............. G01N 27/226
                                                            324/690
6,624,640 B2 *  9/2003  Lund .................. G01R 27/2605
                                                            324/658
(Continued)

FOREIGN PATENT DOCUMENTS

CN        87201131 U   * 12/1987
CN        101060035 A  * 10/2007
(Continued)

OTHER PUBLICATIONS

IET Labs, Inc. Capacitance Standard up to 1F:1417 Series. 1417 Datasheet—Dec. 2015. www.ietlabs.com (Year: 2015).*
(Continued)

*Primary Examiner* — Patrick Assouad
*Assistant Examiner* — Sean Curtis
(74) *Attorney, Agent, or Firm* — Andrew D. Fortney; Central California IP Group, P.C.

(57) ABSTRACT

The disclosure relates to the field of measurement and calibration of capacitance, especially the instrument of transferring capacitance. A wide range capacitor standard box comprises a chassis, 36 physical capacitors, and 4 changeover switches. Output ports are on the front panel of the chassis. 4 dial-switches select the output capacitance in values of 1, 2, 5 times of single-unit capacitance. The changeover switch has input terminals that connect to two electrodes of the physical capacitors, and output terminals that connect to the output ports. Comparing to decade capacitor standard boxes, the present box realizes capacitance outputs from 1 pF~500 mF in values of 1, 2, 5 times of single-unit capacitance. The present box significantly extends the measurement range of capacitance, and makes the capacitor standard box smaller and lighter. By introduc-
(Continued)

ing a compensation function for open and short circuits, it is convenient and suitable for precision measurement.

20 Claims, 5 Drawing Sheets

(51) Int. Cl.
  *H01G 4/38* (2006.01)
  *H01G 2/10* (2006.01)
  *G01R 35/02* (2006.01)
(58) Field of Classification Search
  USPC .................................................. 324/618, 658
  See application file for complete search history.

(56) References Cited

U.S. PATENT DOCUMENTS

| 7,848,079 | B1 * | 12/2010 | Gordin | H01G 4/38 |
|---|---|---|---|---|
| | | | | 361/328 |
| 9,208,944 | B2 * | 12/2015 | Li | H01G 2/10 |
| 9,264,006 | B2 * | 2/2016 | Dodd | H03G 5/02 |
| 10,297,378 | B2 * | 5/2019 | Jin | G01R 35/005 |
| 2013/0177172 | A1 * | 7/2013 | Dodd | H01R 24/58 |
| | | | | 381/98 |
| 2013/0223040 | A1 * | 8/2013 | Li | H01G 4/38 |
| | | | | 361/816 |
| 2019/0234998 | A1 * | 8/2019 | Li | H01G 5/019 |
| 2019/0237249 | A1 * | 8/2019 | Jin | H01G 4/38 |
| 2019/0324071 | A1 * | 10/2019 | Poiron | G01R 21/06 |
| 2020/0119585 | A1 * | 4/2020 | Rodrigues Mansano | |
| | | | | G01R 27/2605 |

FOREIGN PATENT DOCUMENTS

| CN | 201054305 Y | * | 4/2008 | |
| WO | WO-2012055358 A1 | * | 5/2012 | ............... H01G 2/10 |

OTHER PUBLICATIONS

Internet archive date of the IETLabs "Capacitance Standard up to 1F: 1417 Series" NPL. (Year: 2020).*

* cited by examiner

WIDE RANGE CAPACITOR STANDARD BOX

CROSS REFERENCE TO RELATED APPLICATION

This application claims the benefit of Chinese Patent Application No. 201810088041.9 filed on Jan. 30, 2018, incorporated herein by reference as if fully set forth herein.

FIELD OF THE INVENTION

The present invention relates to novel design of wide range capacitor standard box for measurement, verification, and calibration of capacitors, especially the standard instruments of capacitance unit transfer.

BACKGROUND

In the field of measurement and calibration, capacitor standards are specially-made capacitors for measurement, verification, and calibration to ensure repeatable values. They are the standard instruments for capacitance transferring in RF impedance measurement.

In the application of electronic devices and components, capacitor standards can be used as standard electronic sensors, transferring of accurate capacitance in testing of electronic circuits, and improving the accuracy of the sensor.

Regarding capacitance measurement, existing capacitor standard boxes on the market are decade capacitors. The widest range of existing capacitor standard box are 6-dial decade capacitors with a range from $1 \times 10^0$ to $1 \times 10^6$ pF, e.g. 1 pF~1 μF, or 1000 pF~1 mF, which have 60 output values. The disadvantage is the measurement range being limited, large volume, heavy weight. They can't meet the requirements, and are not convenient for transport and field application. From the point of view of future development and demand, existing measurement range can't meet the requirement of capacitance unit transfer and calibration. The capacitor standards of wider range, smaller volume, and light weight are required, such as from 1 pF to 500 mF (e.g. $1 \times 10^{-12} \sim 5 \times 10^{-1}$ F).

Capacitor standard box mainly comprises physical capacitors, changeover switches, output ports. Existing capacitor standard is made of physical capacitors in decade capacitance values of 1 pF~1 μF, or 1000 pF~1 mF. A wider range capacitor standard box is highly demanded in RLC digital bridge measurement.

SUMMARY OF THE INVENTION

The purpose of the invention offered a new solution to design a wider measurement range with 12 sets of 3 physical capacitors in a series values of 1, 2, 5 times of single-unit capacitance. In this design configuration, 4 changeover switches can realize capacitance measurement range from 1 pF to 500 mF (e.g. $1 \times 10^{-12} \sim 5 \times 10^{-1}$ F). Comparing to decade capacitor standard box, this novel design of capacitor standard box has much wider measurement range, smaller volume, and lower weight.

In order to realize the purpose, the present invention implemented technical approaches as below. A wide range capacitor standard box comprises 36 physical capacitors that have the following capacitance values: 1 pF, 2 pF, 5 pF, 10 pF, 20 pF, 50 pF, 100 pF, 200 pF, 500 pF, 1 nF, 2 nF, 5 nF, 10 nF, 20 nF, 50 nF, 100 nF, 200 nF, 500 nF, 1 μF, 2 μF, 5 μF, 10 μF, 20 μF, 50 μF, 100 μF, 200 μF, 500 μF, 1 mF, 2 mF, 5 mF, 10 mF, 20 mF, 50 mF, 100 mF, 200 mF, and 500 mF.

4 changeover switches can output capacitances in a series values of 1, 2, 5 times of single-unit capacitance from 1 pF to 500 mF. The changeover switch has input terminals that connect to two electrodes of physical capacitors, and output terminals that connect to the output ports of capacitor standard box to output the selected capacitance values.

The physical capacitor includes a metal shielding case, and the standard capacitor is installed inside the metal shielding case. Two electrodes of the physical capacitor are respectively connected to input H-terminals and L-terminals of the changeover switch through hermetical feedthroughs 10, and the outer shell (G) is soldered to the metal case as common ground by using a metal strip. P Each of 4 changeover switches has 9-set input terminals including H-terminals and L-terminals.

First changeover switch has 9-set inputs connected to the capacitance values: 1 pF, 2 pF, 5 pF, 10 pF, 20 pF, 50 pF, 100 pF, 200 pF, 500 pF.

Second changeover switch has 9-set inputs connected to the capacitance values: 1 nF, 2 nF, 5 nF, 10 nF, 20 nF, 50 nF, 100 nF, 200 nF, 500 nF.

Third changeover switch has 9-set inputs connected to the capacitance values: 1 μF, 2 μF, 5 μF, 10 μF, 20 μF, 50 μF, 100 μF, 200 μF, 500 μF.

Fourth changeover switch has 9-set inputs connected to the capacitance values: 1 mF, 2 mF, 5 mF, 10 mF, 20 mF, 50 mF, 100 mF, 200 mF, and 500 mF.

The changeover switch comprises a metal shielding case and multiple-ceramics-disc switch that is installed inside the metal shielding case. A metal wall separates the metal shielding case into two compartments, and divides multiple-ceramics-disc switch into two equivalent parts that are used for H-terminal and L-terminal inputs that connect to two electrodes of physical capacitors respectively.

The multiple-ceramics-disc switch has multiple discs in the two compartments. There is one disc to connect to the output terminal in each compartment. The other 9 discs connect to the input terminals respectively in each compartment.

The wide range capacitor standard box has 4 dials to control 4 changeover switches and select the output capacitance.

The changeover switches can rotate 300° or 360°.

The wide range capacitor standard box employs 4-port BNC and 3-port BNC outputs.

The changeover switch adopts the positions of open and short circuits for parasitic compensation.

The changeover switch has one of ceramics discs in both shielded H-terminal and L-terminal compartments. One disc has OH and SH terminals in H-terminal compartment, and another disc has OL and SL terminals in L-terminal compartment. SH and SL are connected together for short circuit compensation, and OH and OL are unconnected for open circuit compensation.

Based on above description, the benefits of the present invention are as below:

1. The wide range capacitor standard employs 4 changeover switches to output capacitance in a series values of 1, 2, 5 times of single-unit capacitance with the measurement range from 1 pF to 500 mF. Existing capacitor standard box outputs decade capacitance with 6-dial control, which can only have measurement range from 1 pF~1 μF, or 1000 pF~1 mF. The present invention significantly extended the measurement range of capacitance.

2. By introducing a compensation function for open and short circuits, these two compensation processes can simultaneously remove the parasitic from the input ports of RLC Bridge, testing cables, and internal wires and connectors of the capacitor standard. It is easy to use, can improve the accuracy, and ensure the repeatability after the compensation. Since existing capacitor standard doesn't have these feature, its compensation just involves the input ports of RLC digital bridge, and testing cables, and do not include the internal connection wires and input and output terminals of changeover switches, which will result in certain error. Especially in the case of large capacitance (low impedance), the uncertainty becomes significant.

3. Due to using 3 capacitors in a series values of 1, 2, 5 times of single-unit capacitance, the volume and weight of the capacitor standard are reduced, and the wide measurement range of capacitance are achieved. It is also convenient for transport and field application.

EMBODIMENT OF THE INVENTION

Describe the invention in details with attached drawings as the following sections.

The purpose, advantage, and technical approach of the invention are described in details with attached drawings and embodiment. It should be noted that the embodiment is just used for describing the invention, which is not the application limitation of the invention.

Figure 1:
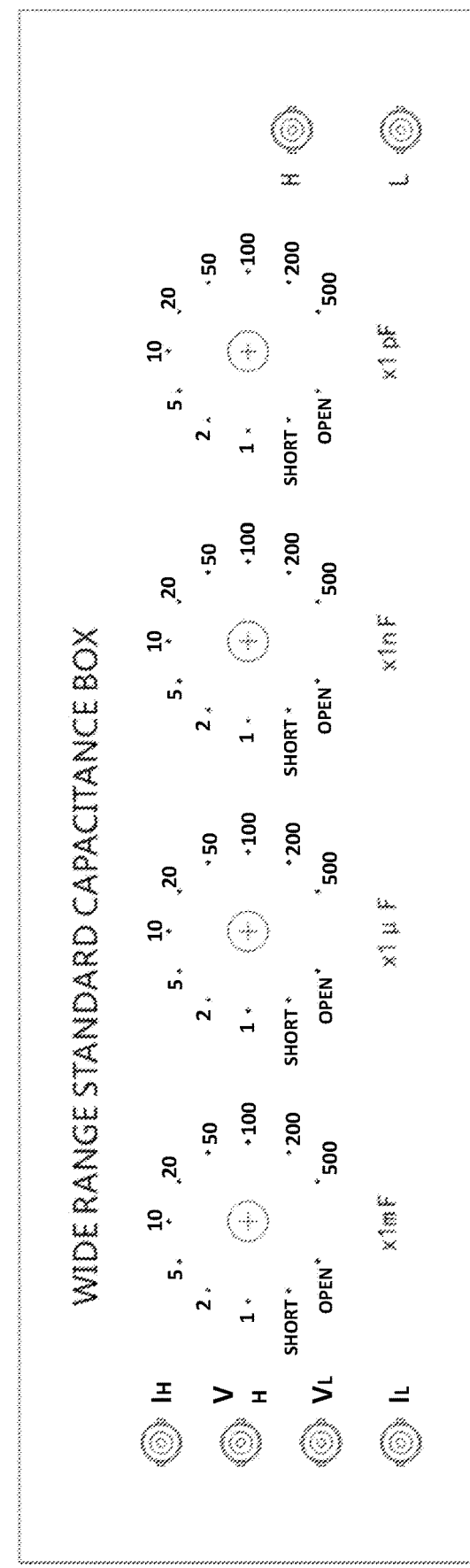
FIG. 1 is the front panel of a wide range capacitor standard box.
Figure 2:
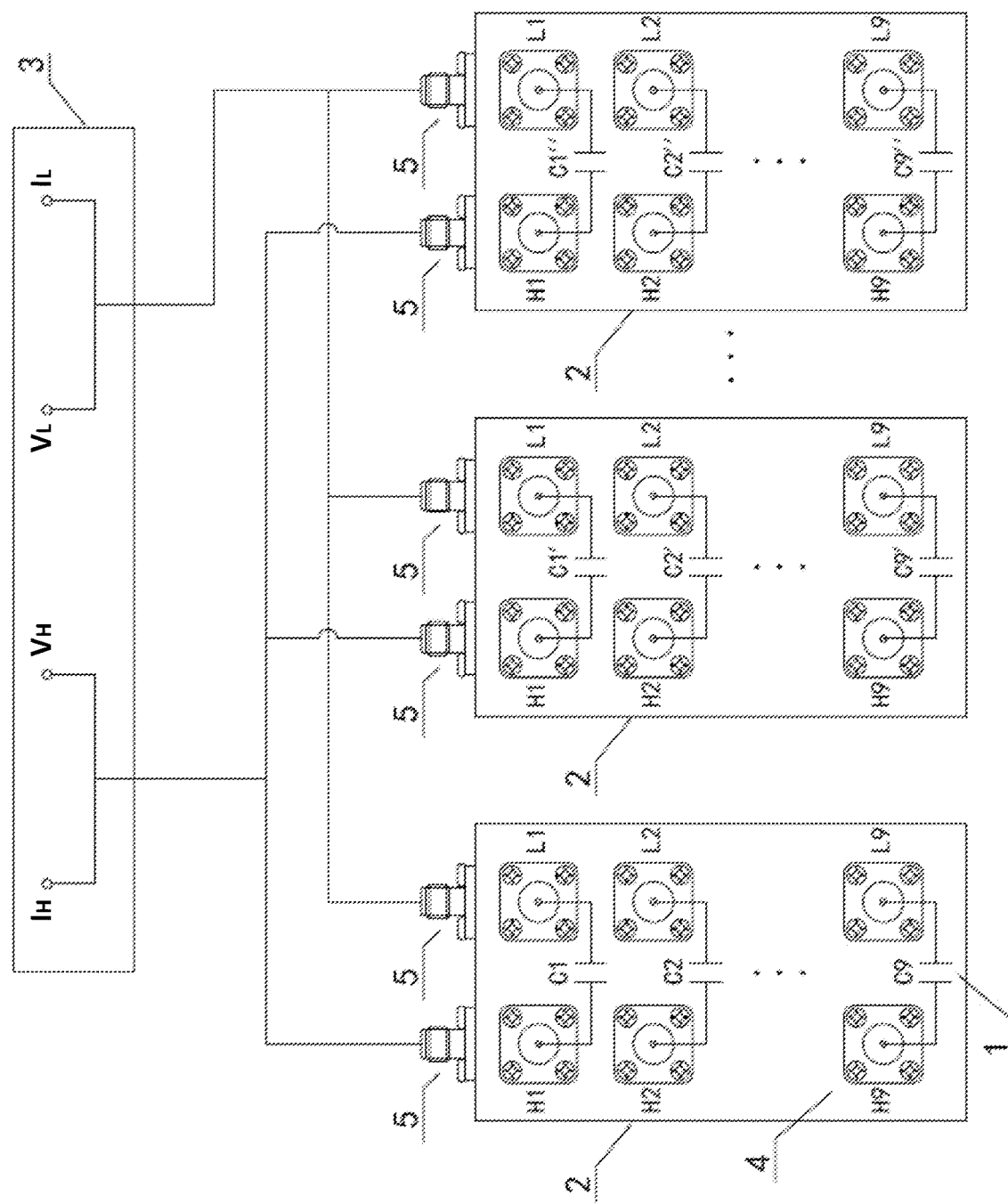
FIG. 2 is the system diagram of the wide range capacitor standard box.
Figure 3:
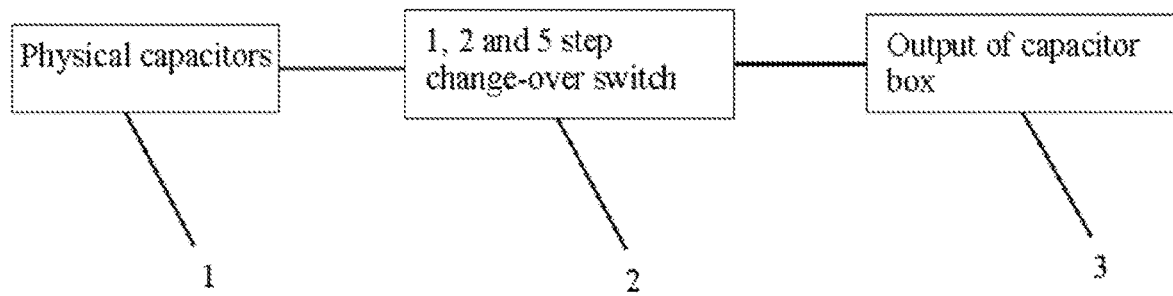
FIG. 3 is the block diagram of the wide range capacitor standard box.

Refer to FIG. 1 to 3, a wide range capacitor standard box compromises 36 physical capacitors 1 that have the following capacitance values: 1 pF, 2 pF, 5 pF, 10 pF, 20 pF, 50 pF, 100 pF, 200 pF, 500 pF, 1 nF, 2 nF, 5 nF, 10 nF, 20 nF, 50 nF, 100 nF, 200 nF, 500 nF, 1 µF, 2 µF, 5 µF, 10 µF, 20 µF, 50 µF, 100 µF, 200 µF, 500 µF, 1 mF, 2 mF, 5 mF, 10 mF, 20 mF, 50 mF, 100 mF, 200 mF, and 500 mF. The wide range capacitor standard box can output capacitances in a series values of 1, 2, 5 times of single-unit capacitance from 1 pF to 500 mF.

4 changeover switches 2 can select capacitances in a series values of 1, 2, 5 times of single-unit capacitance. The changeover switch has input terminals 4 that connect to two electrodes of physical capacitors 1, and output terminals 5 that connect to output ports 3 of the capacitor standard box to output the selected capacitance values.

The wide range capacitor standard employs 4-port BNC and 3-port BNC outputs 3, which includes H-port and L-port 3. The changeover switch 5 has H-terminal and L-terminal outputs. The H-terminals and L-terminals of 4 changeover switches are connected respectively in parallel to the H-port and L-port outputs of the capacitor standard box. Furthermore H-port output is connected to $V_H$-port and $I_H$-port outputs, L-port output is connected to $V_L$-port and $I_L$-port outputs.

Figure 4:
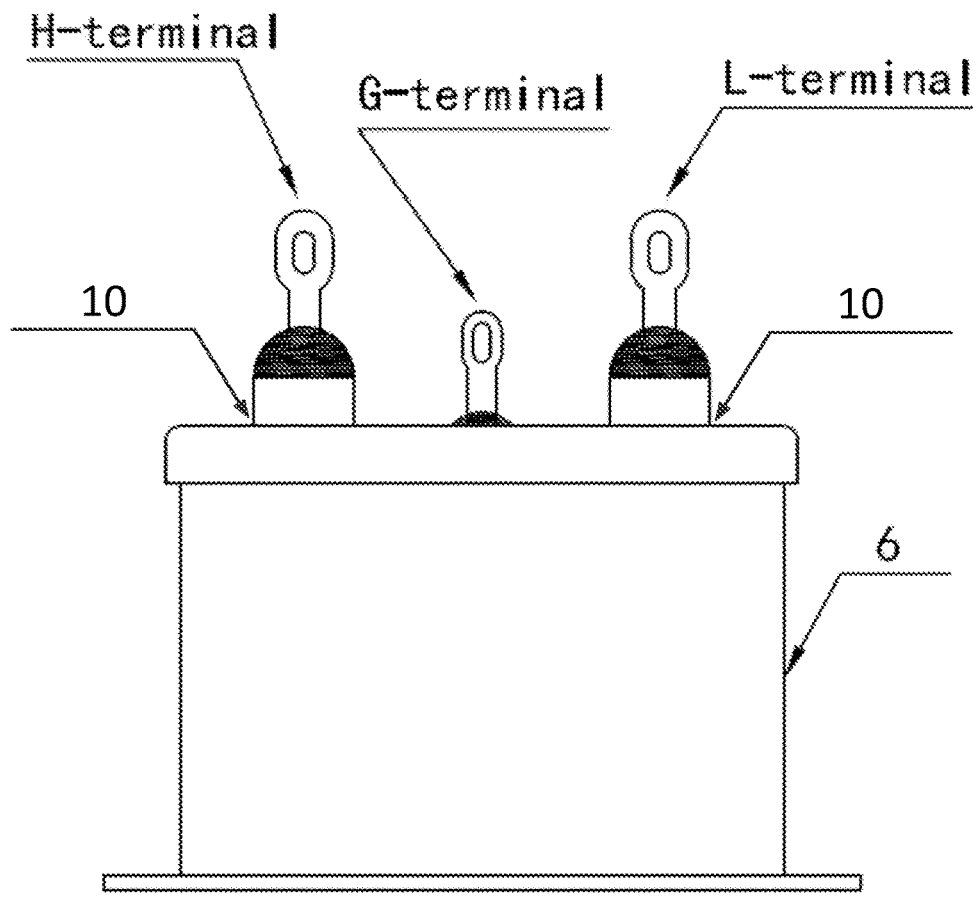
FIG. 4 is the capacitor outline of the wide range capacitor standard box.

Referring to FIG. 4, the physical capacitor includes metal shielding case, and the standard capacitor is installed inside the metal shielding case. Two electrodes of each capacitor are connected respectively to the H-terminal and L-terminal inputs of the changeover switch via feedthroughs 10, and the metal case 6 of each capacitor is welded to the metal shielding case from G-terminal by using a metal strip.

Figure 5:
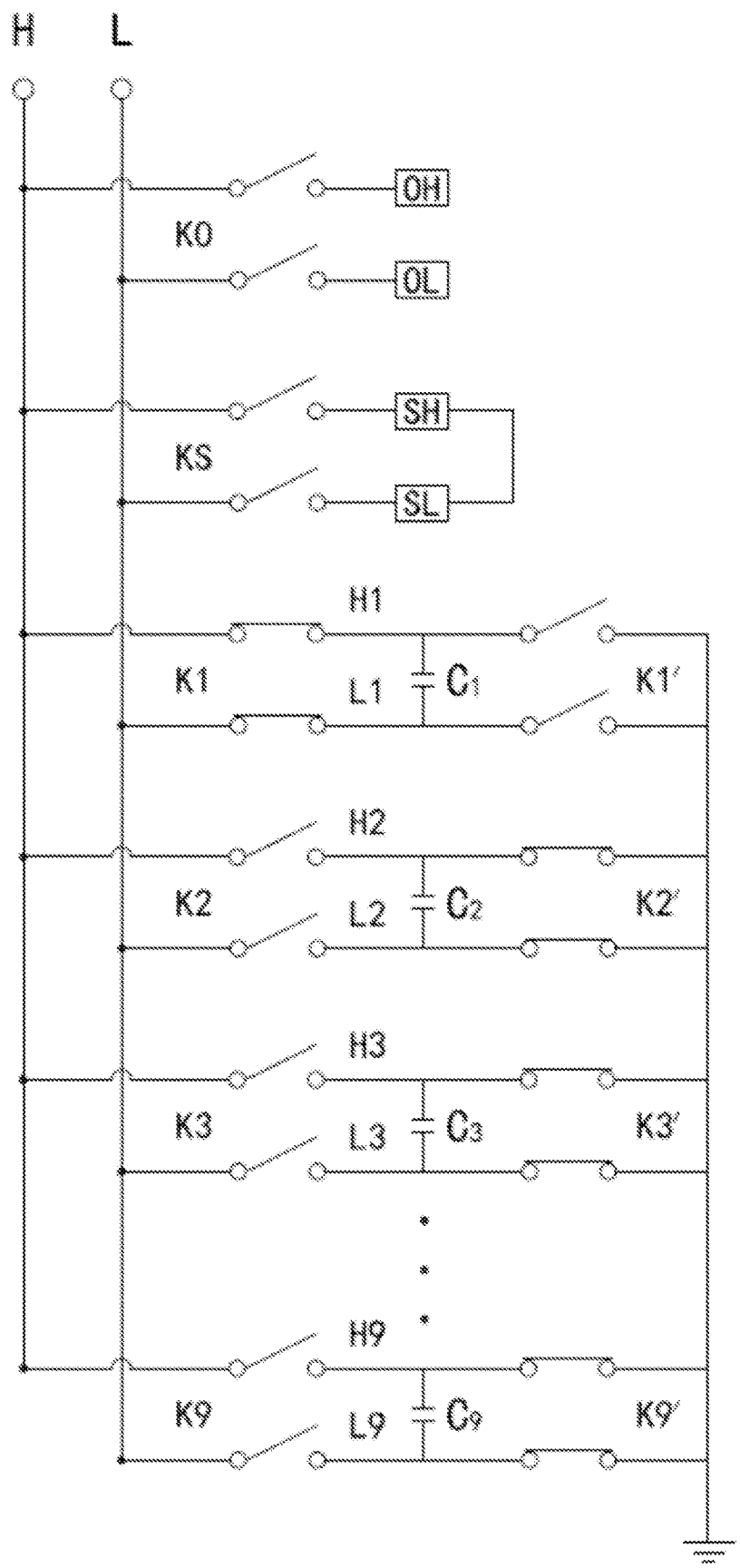
FIG. 5 is the circuit diagram of the wide range capacitor standard box.
Figure 6:
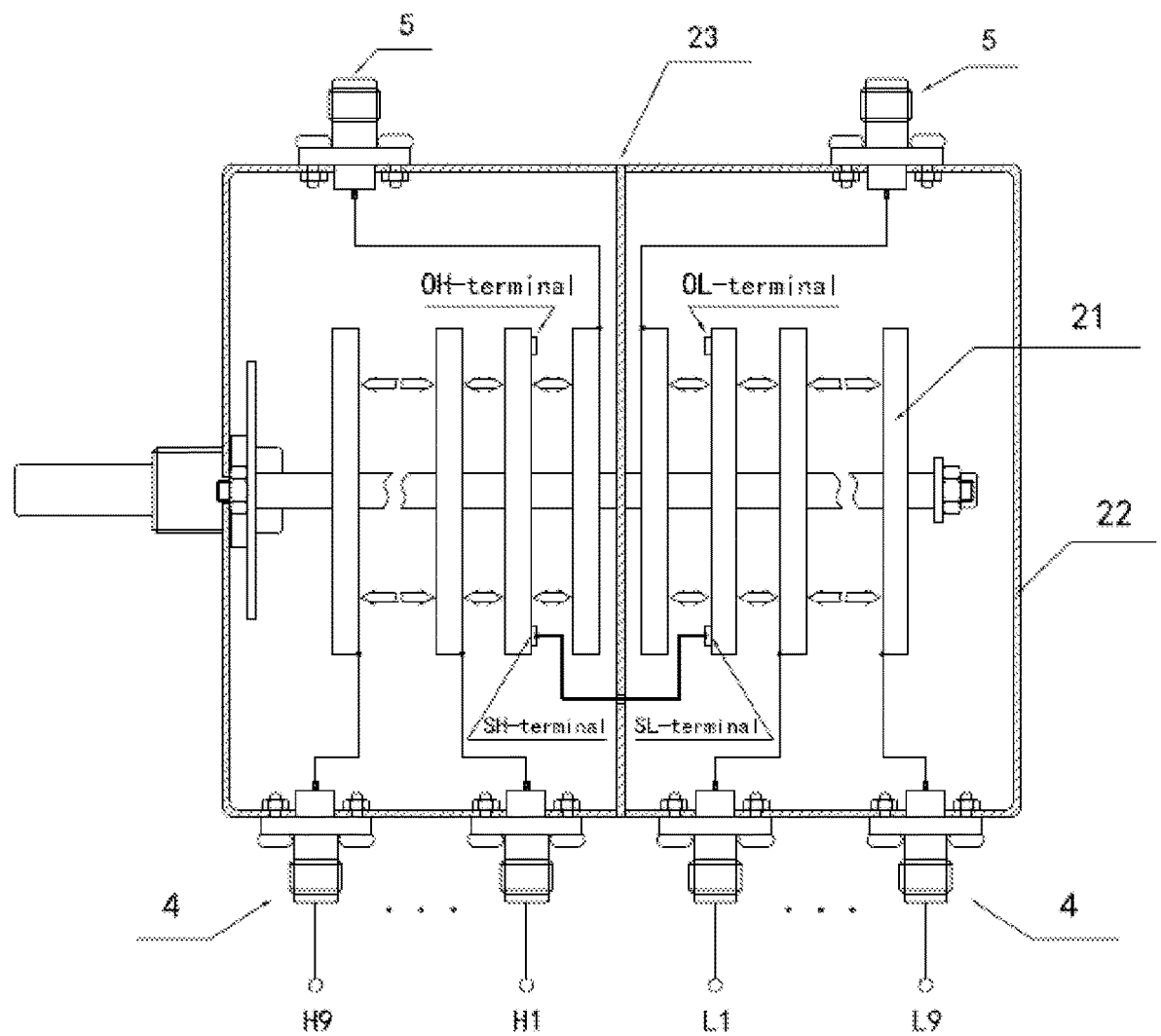
FIG. 6 is the structure of a changeover switch of the wide range capacitor standard box.

Refer to FIGS. 5 and 6, the changeover switch has 9-set inputs that include H-terminals (H1, H2, . . . H9) and L-terminals (L1, 12 . . . L9).

The 9-set inputs of first changeover switch are connected to the capacitors of 1 pF, 2 pF, 5 pF, 10 pF, 20 pF, 50 pF, 100 pF, 200 pF, 500 pF, respectively.

The 9-set inputs of second changeover switch are connected to the capacitors of 1 nF, 2 nF, 5 nF, 10 nF, 20 nF, 50 nF, 100 nF, 200 nF, 500 nF, respectively.

The 9-set inputs of third changeover switch are connected to the capacitors of 1 µF, 2 µF, 5 µF, 10 µF, 20 µF, 50 µF, 100 µF, 200 µF, 500 µF, respectively.

The 9-set inputs of firth changeover switch are connected to the capacitors of 1 mF, 2 mF, 5 mF, 10 mF, 20 mF, 50 mF, 100 mF, 200 mF, and 500 mF, respectively.

The changeover switch 2 comprises a metal shielding case 22 and multiple-ceramics-disc switch 21. Therein a metal wall 23 separates the metal shielding case 22 into two compartments, and divides multiple-ceramics-disc switch 21 into two equal parts, which are used for H-terminal and L-terminal inputs to connect to two electrodes of physical capacitors respectively.

The multiple-ceramics-disc switch 21 has multiple discs (e.g. 11 discs) in each of two compartments. There is one disc to connect to the output terminal 5 in each compartment and the other 9 discs connect to the input terminals respectively in each compartment. It should be noted that each disc of multiple-ceramics-disc switch 21 connected to one input 4 is just one embodiment of the invention to illustrate an example. It is easy to implement multiple inputs connecting to one disc.

The wide range capacitor standard box has 4 dials that control 4 changeover switches 21 to select the output capacitance or open/short.

The changeover switches can rotate 300° or 360° to select output capacitance and On/Off in a step of 300. The rotation step can be adjusted to other than 300.

The changeover switch 2 has a compensation function for open and short circuits. The 4 dials corresponding to 4 changeovers have two positions of the open and short status. Specifically, one ceramics disc in H-terminal compartment of the changeover switch 21 has OH and SH contact points. Another ceramics disc in L-terminal compartment of the changeover switch 21 has OL and SL contact points. SH and SL are connected together for short circuit compensation, OH and OL are unconnected for open circuit compensation. These two compensation processes can remove the parasitic in the whole system including input ports of RLC Bridge, testing cables, and internal wires and connectors of the capacitor standard, etc. Comparing to existing compensation method, the novel design is convenient for operation, and improves the accuracy and repeatability in high precision measurement and calibration.

Although preferred embodiment and specific example have been illustrated and described herein, other embodiments and examples may perform similar functions and/or achieve like results. All such equivalent embodiments and examples are within the spirit and scope of the present invention, are contemplated thereby, and are intended to be covered by the claims.

The invention claimed is:

1. A capacitor standard box, comprising:
a set of 36 physical capacitors that respectively have capacitance values of 1 pF, 2 pF, 5 pF, 10 pF, 20 pF, 50 pF, 100 pF, 200 pF, 500 pF, 1 nF, 2 nF, 5 nF, 10 nF, 20 nF, 50 nF, 100 nF, 200 nF, 500 nF, 1 µF, 2 µF, 5 µF, 10 µF, 20 µF, 50 µF, 100 µF, 200 µF, 500 µF, 1 mF, 2 mF, 5 mF, 10 mF, 20 mF, 50 mF, 100 mF, 200 mF, and 500 mF; and
a plurality of changeover switches, each of which is (i) configured to output a capacitance from a subset of the set of 36 physical capacitors and (ii) comprises a metal case configured to shield a corresponding one of the changeover switches, wherein each of the changeover switches has input terminals that connect to two electrodes of a respective one of the subsets of the physical capacitors and output terminals that connect to output ports of the capacitor standard box, and the physical capacitors in a specific one of the subsets are not in any other subset.

2. The capacitor standard box according to claim 1, further comprising a metal shielding case, wherein the set of 36 physical capacitors are inside the metal shielding case.

3. The wide range capacitor standard box according to claim 2, wherein each of the physical capacitors have two electrodes respectively connected by a hermetical feedthrough to a first input terminal and a second input terminal of a same or different one of the changeover switches.

4. The capacitor standard box according to claim 2, further comprising an outer shell soldered to the metal shielding case to form a common ground.

5. The capacitor standard box according to claim 2, wherein each of the changeover switches has nine sets of input terminals, each set of input terminals including an H-terminal and an L-terminal.

6. The capacitor standard box according to claim 5, wherein:
the plurality of changeover switches comprises first, second, third and fourth changeover switches,
the set of input terminals of the first changeover switch is connected to the physical capacitors having the capacitance values 1 pF, 2 pF, 5 pF, 10 pF, 20 pF, 50 pF, 100 pF, 200 pF, and 500 pF;
the set of input terminals of the second changeover switch is connected to the physical capacitors having the capacitance values 1 nF, 2 nF, 5 nF, 10 nF, 20 nF, 50 nF, 100 nF, 200 nF, and 500 nF;
the set of input terminals of the third changeover switch is connected to the physical capacitors having the capacitance values 1 µF, 2 µF, 5 µF, 10 µF, 20 µF, 50 µF, 100 µF, 200 µF, and 500 µF;
the set of input terminals of the fourth changeover switch is connected to the physical capacitors having the capacitance values 1 mF, 2 mF, 5 mF, 10 mF, 20 mF, 50 mF, 100 mF, 200 mF, and 500 mF.

7. The capacitor standard box according to claim 5, wherein each of the changeover switches comprises (i) a multiple-ceramic-disc switch inside the metal case and (ii) a metal shielding wall that separates the metal case into two compartments and divides the multiple-ceramic-disc switch into two parts that respectively connect the H-terminal and the L-terminal to a unique one of the two electrodes of the subset of the physical capacitors.

8. The capacitor standard box according to claim 7, wherein the multiple-ceramic-disc switch comprises multiple discs in each of the two compartments, wherein one of the multiple discs in each compartment connects to one of the output terminals, and a plurality of the multiple discs in each compartment other than the one multiple disc connect to either the H-terminals or the L-terminals.

9. The capacitor standard box according to claim 8, further comprising a plurality of dials corresponding to the plurality of changeover switches, wherein each of the plurality of dials is configured to select the capacitance from a corresponding one of the plurality of changeover switches.

10. The capacitor standard box according to claim 9, wherein each of the plurality of dials is further configured to select an open or short output.

11. The capacitor standard box according to claim 9, wherein each of the plurality of dials and each of the plurality of changeover switches is rotatable from 300° to 360°.

12. The capacitor standard box according to claim 11, further comprising the output ports, wherein each of the output ports comprises a 3- or 4-port Bayonet Neill Concelman (BNC) connector.

13. The capacitor standard box according to claim 1, wherein each of the plurality of changeover switches includes a compensation function.

14. The capacitor standard box according to claim 13, wherein each of the plurality of changeover switches further includes positions for open and short circuits, and the compensation function comprises parasitic compensation.

15. The capacitor standard box according to claim 8, wherein each of the plurality of changeover switches includes a compensation function.

16. The capacitor standard box according to claim 15, wherein one of the two compartments is an H-terminal compartment, the other of the two compartments is an L-terminal compartment, one of the multiple discs in each of the H-terminal and L-terminal compartments includes open circuit and short circuit terminals, the short circuit terminals in the H-terminal and L-terminal compartments are connected together for short circuit compensation, and the open circuit terminals in the H-terminal and L-terminal compartments are unconnected for open circuit compensation.

17. The capacitor standard box according to claim 1, wherein the set of 36 physical capacitors consists of the 36 physical capacitors.

18. A capacitor standard box, comprising:
a plurality of physical capacitors that have capacitance values of 1 pF, 2 pF, 5 pF, 10 pF, 20 pF, 50 pF, 100 pF, 200 pF, 500 pF, 1 nF, 2 nF, 5 nF, 10 nF, 20 nF, 50 nF, 100 nF, 200 nF, 500 nF, 1 µF, 2 µF, 5 µF, 10 µF, 20 µF, 50 µF, 100 µF, 200 µF, 500 µF, 1 mF, 2 mF, 5 mF, 10 mF, 20 mF, 50 mF, 100 mF, 200 mF, and 500 mF;
a plurality of changeover switches, each of which is (i) configured to output a capacitance and (ii) comprises a metal case configured to shield a corresponding one of the changeover switches, wherein each of the changeover switches has (a) nine sets of input terminals that connect to two electrodes of at least one of the physical capacitors, each set of input terminals including an H-terminal and an L-terminal, and (b) output terminals that connect to output ports of the capacitor standard box; and
a metal shielding case, wherein the plurality of physical capacitors are inside the metal shielding case.

19. The capacitor standard box according to claim 18, wherein:
the plurality of changeover switches comprises first, second, third and fourth changeover switches, the set of input terminals of the first changeover switch is connected to the physical capacitors having the capacitance values 1 pF, 2 pF, 5 pF, 10 pF, 20 pF, 50 pF, 100 pF, 200 pF, and 500 pF;

the set of input terminals of the second changeover switch is connected to the physical capacitors having the capacitance values 1 nF, 2 nF, 5 nF, 10 nF, 20 nF, 50 nF, 100 nF, 200 nF, and 500 nF;

the set of input terminals of the third changeover switch is connected to the physical capacitors having the capacitance values 1 μF, 2 μF, 5 μF, 10 μF, 20 μF, 50 μF, 100 μF, 200 μF, and 500 μF;

the set of input terminals of the fourth changeover switch is connected to the physical capacitors having the capacitance values 1 mF, 2 mF, 5 mF, 10 mF, 20 mF, 50 mF, 100 mF, 200 mF, and 500 mF.

20. The capacitor standard box according to claim 18, wherein each of the changeover switches comprises (i) a multiple-ceramic-disc switch inside the metal case and (ii) a metal shielding wall that separates the metal case into two compartments and divides the multiple-ceramic-disc switch into two parts that respectively connect the H-terminal and the L-terminal to a unique one of the two electrodes.

\* \* \* \* \*

UNITED STATES PATENT AND TRADEMARK OFFICE
CERTIFICATE OF CORRECTION

PATENT NO. : 10,930,432 B2  
APPLICATION NO. : 16/253534  
DATED : February 23, 2021  
INVENTOR(S) : Pan Jin et al.

Page 1 of 1

It is certified that error appears in the above-identified patent and that said Letters Patent is hereby corrected as shown below:

On the Title Page

Item (72), Inventors: Change "Pu Lin" to "Lin Pu"

Signed and Sealed this  
Eleventh Day of May, 2021

Drew Hirshfeld  
*Performing the Functions and Duties of the*  
*Under Secretary of Commerce for Intellectual Property and*  
*Director of the United States Patent and Trademark Office*